(12) United States Patent
McReynolds et al.

(10) Patent No.: US 7,355,818 B2
(45) Date of Patent: Apr. 8, 2008

(54) DISC DRIVE INTEGRAL ACTUATOR PINS

(75) Inventors: Dave Paul McReynolds, Loveland, CO (US); David Ray Lapp, Boulder, CO (US); Frank William Bernett, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 484 days.

(21) Appl. No.: 10/844,983

(22) Filed: May 12, 2004

(65) Prior Publication Data

US 2005/0254176 A1 Nov. 17, 2005

(51) Int. Cl.
*G11B 21/08* (2006.01)

(52) U.S. Cl. .................................. 360/264.2

(58) Field of Classification Search ............. None
See application file for complete search history.

(56) References Cited

U.S. PATENT DOCUMENTS

| | | | |
|---|---|---|---|
| 5,103,359 A | | 4/1992 | Marazzo |
| 5,644,452 A * | | 7/1997 | Cox et al. ................ 360/264.2 |
| 5,838,519 A | | 11/1998 | Takizawa et al. |
| 5,991,121 A | | 11/1999 | Kanda |
| 6,201,667 B1 * | | 3/2001 | Yamamoto et al. ...... 360/264.2 |
| 6,369,987 B1 | | 4/2002 | Khan et al. |
| 6,665,149 B2 * | | 12/2003 | Abe ........................ 360/264.2 |
| 6,721,135 B2 * | | 4/2004 | Hong et al. .............. 360/264.2 |
| 6,724,578 B2 * | | 4/2004 | Watanabe ................ 360/264.2 |
| 6,765,763 B2 * | | 7/2004 | SeeToh et al. ........... 360/264.2 |
| 6,781,795 B2 * | | 8/2004 | Abe et al. ................ 360/264.2 |
| 6,992,864 B2 * | | 1/2006 | Kaneko et al. .......... 360/264.2 |
| 7,227,725 B1 * | | 6/2007 | Chang et al. ............ 360/264.2 |
| 2002/0105761 A1 * | | 8/2002 | Abe et al. ................ 360/264.2 |
| 2002/0159196 A1 | | 10/2002 | Watanabe |
| 2002/0186507 A1 | | 12/2002 | Riener |
| 2003/0002222 A1 * | | 1/2003 | Abe ........................ 360/264.2 |
| 2003/0043508 A1 * | | 3/2003 | Schulz et al. ............ 360/245.9 |
| 2005/0013055 A1 * | | 1/2005 | Ho et al. ................. 360/264.2 |
| 2005/0195530 A1 * | | 9/2005 | MacPherson ............ 360/264.2 |
| 2006/0232890 A1 * | | 10/2006 | Ho et al. ................. 360/245.9 |

* cited by examiner

*Primary Examiner*—Allen Cao
(74) *Attorney, Agent, or Firm*—Derek J. Berger (57) ABSTRACT

A method for attaching a printed circuit card assembly to an actuator assembly in a disc drive comprises forming one or more pins integrally with the actuator assembly, inserting each pin through a corresponding pin opening in the printed circuit card assembly, and attaching the pins to the printed circuit card assembly. The pins may be attached to the printed circuit card assembly by a soldering process, or alternatively, pressure may be applied to a top surface of the pins to cause them to deform over the printed circuit card assembly, thereby securing the printed circuit card assembly to the actuator assembly. A disc drive in accordance with a preferred embodiment of this invention has an actuator assembly with one or more integral pins and a printed circuit card assembly attached to the integral pins.

22 Claims, 6 Drawing Sheets

DISC DRIVE INTEGRAL ACTUATOR PINS

FIELD OF THE INVENTION

This application relates generally to disc drives and more particularly to pins formed integrally with the actuator assembly of a disc drive for attaching a printed circuit card assembly, and a method for attaching a printed circuit card assembly to the actuator assembly.

BACKGROUND OF THE INVENTION

Disc drives store digital data in magnetic form on a rotating data storage disc. Modern disc drives comprise one or more rigid data storage discs that are coated with a magnetizable medium and mounted on a spindle motor for rotation at a constant high speed. Information is stored on the discs in a plurality of concentric circular tracks (collectively referred to as the "data region") typically by an array of transducers ("read/write heads") mounted to a radial actuator for movement of the heads in an arc over the surface of the discs. The read/write heads are used to transfer data between a desired track and an external environment.

The transducers or heads are mounted on sliders via flexures at the ends of a plurality of actuator arms that project radially outward from the actuator body. The actuator body pivots about a shaft mounted to the disc drive housing at a position closely adjacent the outer extreme of the discs. The pivot shaft is parallel with the axis of rotation of the spindle motor and the discs, so that the heads move in a plane parallel with the surfaces of the discs.

A printed circuit board assembly ("PCB"), which is mounted to a bottom surface or base plate of the disc drive, contains a majority of the electronics that are essential to the operation of the disc drive. For example, the PCB includes electrical components that control the speed of the spindle and position of the heads over the discs. Similarly, the PCB also includes electrical components that interface with the host computing system. The PCB is electrically connected to a printed circuit card assembly ("PCCA") attached to the actuator arm via a flex cable. The PCCA amplifies the signal coming from the read/write head, acts as a ground, and reduces noise. Typically, the PCCA is held in place on the actuator arm by small gold-plated pins that are press-fit into the actuator arm. During the manufacturing process, openings are stamped into the actuator to receive the gold pins. The pins are then press-fit into the actuator arm. The PCCA has apertures that correspond to the pins so that when the PCCA is placed over the pins they secure it in place. Finally, the PCCA is soldered to the pins.

This manufacturing process is labor intensive and expensive because the gold pins are a separate and expensive part and the soldering step must be performed manually. Additionally, the solder used to secure the PCCA to the pins contains particulates that can adversely affect disc drive performance.

Accordingly there is a need for an actuator assembly without separate PCCA pins and for a method of attaching the PCCA to the actuator assembly that does not require solder or substantial manual labor. The present invention provides a solution to this and other problems, and offers other advantages over the prior art.

SUMMARY OF THE INVENTION

Against this backdrop the present invention has been developed. One embodiment of this invention is a method for attaching a printed circuit card assembly to an actuator assembly in a disc drive. First, one or more pins are formed integrally with the actuator assembly. Each pin is then inserted through a corresponding pin opening in the printed circuit card assembly. Next, the pins are attached to the printed circuit card assembly. The pins may be attached to the printed circuit card assembly in a number of ways, including by soldering the pins to a printed circuit card assembly. Alternatively, pressure may be applied to a top surface of the pins to cause them to deform over the printed circuit card assembly, thereby securing the printed circuit card assembly to the actuator assembly.

Another embodiment of the present invention is a disc drive, having a data storage disc mounted to a base plate, an actuator assembly pivotally attached to the base plate adjacent the disc, and a printed circuit card assembly attached to the actuator assembly. One or more pins, each of which may have a stem and a cap, are formed integrally with the actuator assembly.

These and various other features as well as advantages which characterize the present invention will be apparent from a reading of the following detailed description and a review of the associated drawings.

DETAILED DESCRIPTION

Figure 1:
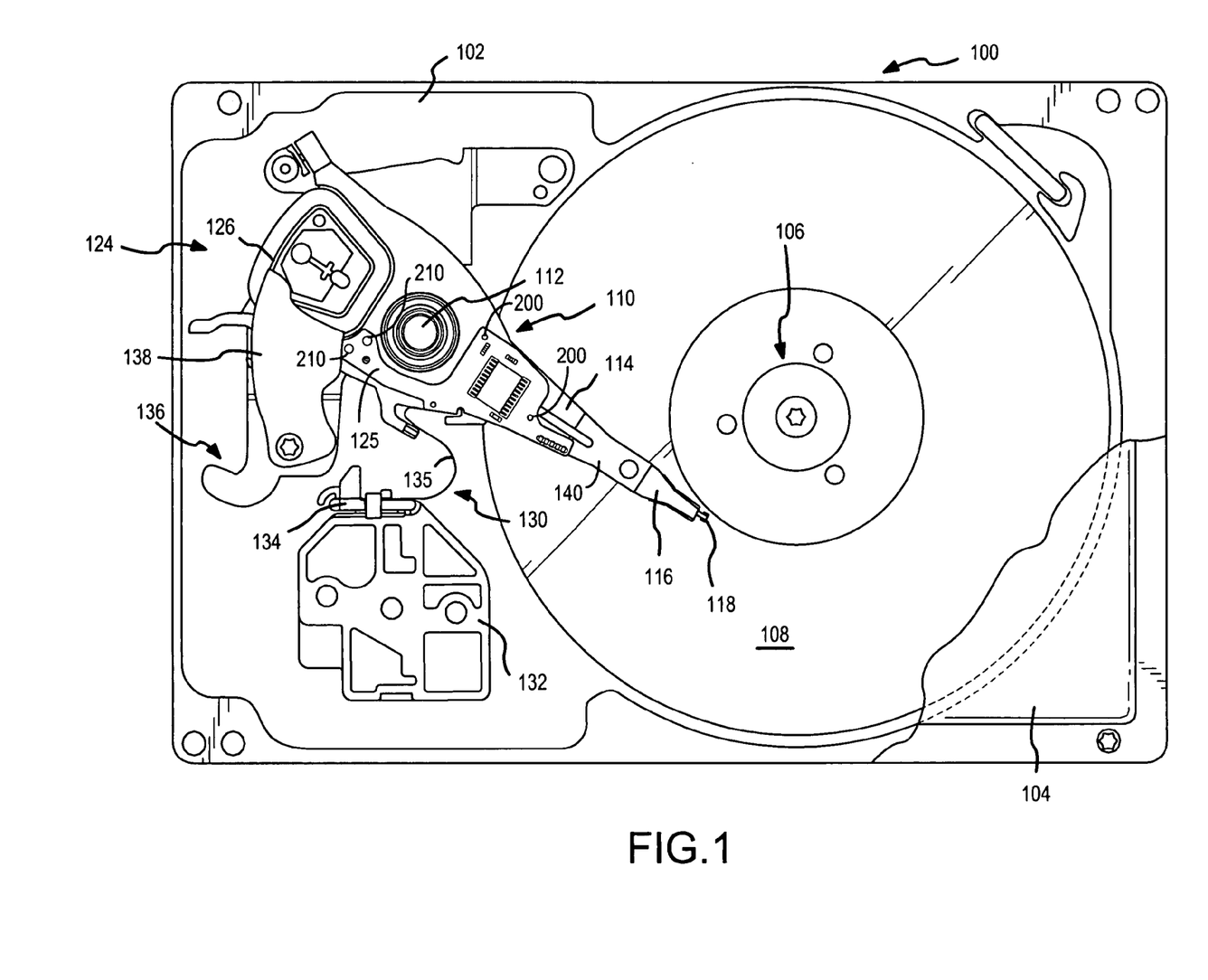
FIG. 1 is a plan view of a disc drive incorporating a preferred embodiment of the present invention showing a cover and a top pole partially cut away.

A disc drive 100 constructed in accordance with a preferred embodiment of the present invention is shown in FIG. 1. The disc drive 100 includes a base plate 102 to which various components of the disc drive 100 are mounted. A top cover 104, shown partially cut away, cooperates with the base 102 to form an internal, sealed environment for the disc drive in a conventional manner. The components include a spindle motor 106 that rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes one or more actuator arms 114 which extend towards the discs 108, with one or more flexures 116 extending from the actuator arms 114. The actuator assembly further includes one or more read/write heads 118 mounted at the distal end of each of the flexures 116 on a fluid bearing slider that enables the heads 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110 between a bottom pole 136 attached to the base plate 102 and a top pole 138, which is attached in spaced relation to the bottom pole 136, as well as one or more permanent magnets 128 that establish a magnetic field in which the coil 126 is immersed. The controlled application of current to the coil 126 causes magnetic interaction between the permanent magnets 128, the top pole 138, the bottom pole 136, and the coil 126 so that the coil 126 moves in accordance with the well-known Lorentz relationship. As the coil 126 moves, the actuator assembly 110 pivots about the bearing shaft assembly 112, and the heads 118 are caused to move over the surfaces of the discs 108.

A flex assembly 130 provides the requisite electrical connection paths for the actuator assembly 110 and VCM 124 while allowing pivotal movement of the actuator assembly 110 during operation. The flex assembly 130 includes a printed circuit board ("PCB") 132 connected to a printed circuit card assembly ("PCCA") 140 via a flex cable 135. Head wires (not shown) connect the PCCA 140 to the read/write heads 118 and are routed from the PCCA 140 along the actuator arm 114 and the flexures 116 to the heads 118. The PCCA 140 contains circuitry for controlling and performing many disc drive functions, typically including, without limitation, controlling the write currents applied to the heads 118 during a write operation, amplifying read signals generated by the heads 118 during a read operation, and controlling noise within the disc drive. The PCB 132 contains circuitry for controlling disc drive operation including, without limitation, controlling the speed of disc rotation and interfacing the heads 118 with the host computing system. In addition to connecting the heads 118 with the PCB 132, the PCCA 140 may also include a coil connecting cable 125 connected to the coil 126 of the voice coil motor 124 so that the PCB 132 may control the VCM 124 and thus the movement of the heads 118 over the discs 108. The flex assembly 130 terminates at a flex bracket 134 for communication through the base plate 102 to the PCB 132, which is mounted to the bottom side of the base plate 102.

Figure 2:
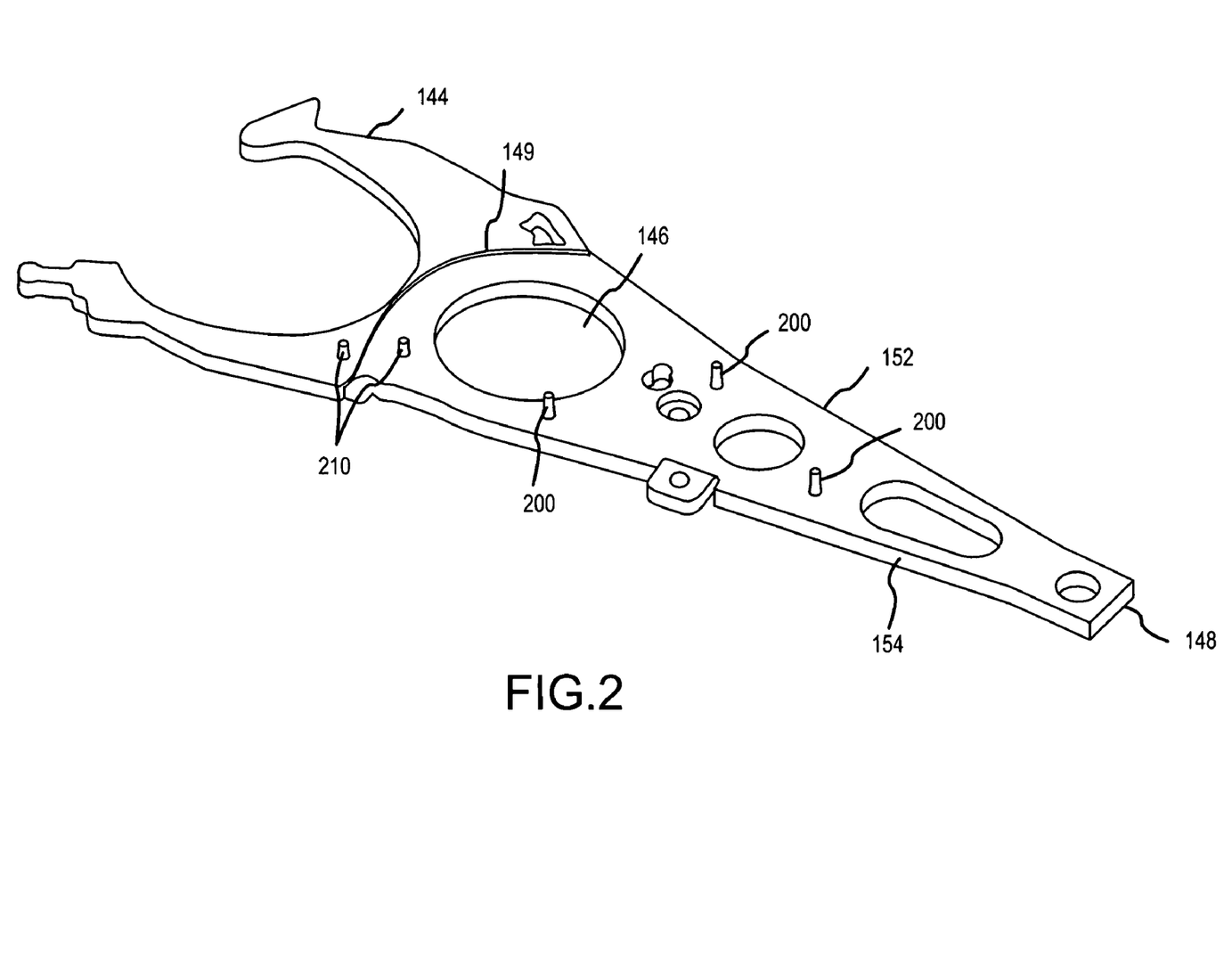
FIG. 2 is a top perspective view of the actuator arm shown in FIG. 1.
Figure 3:
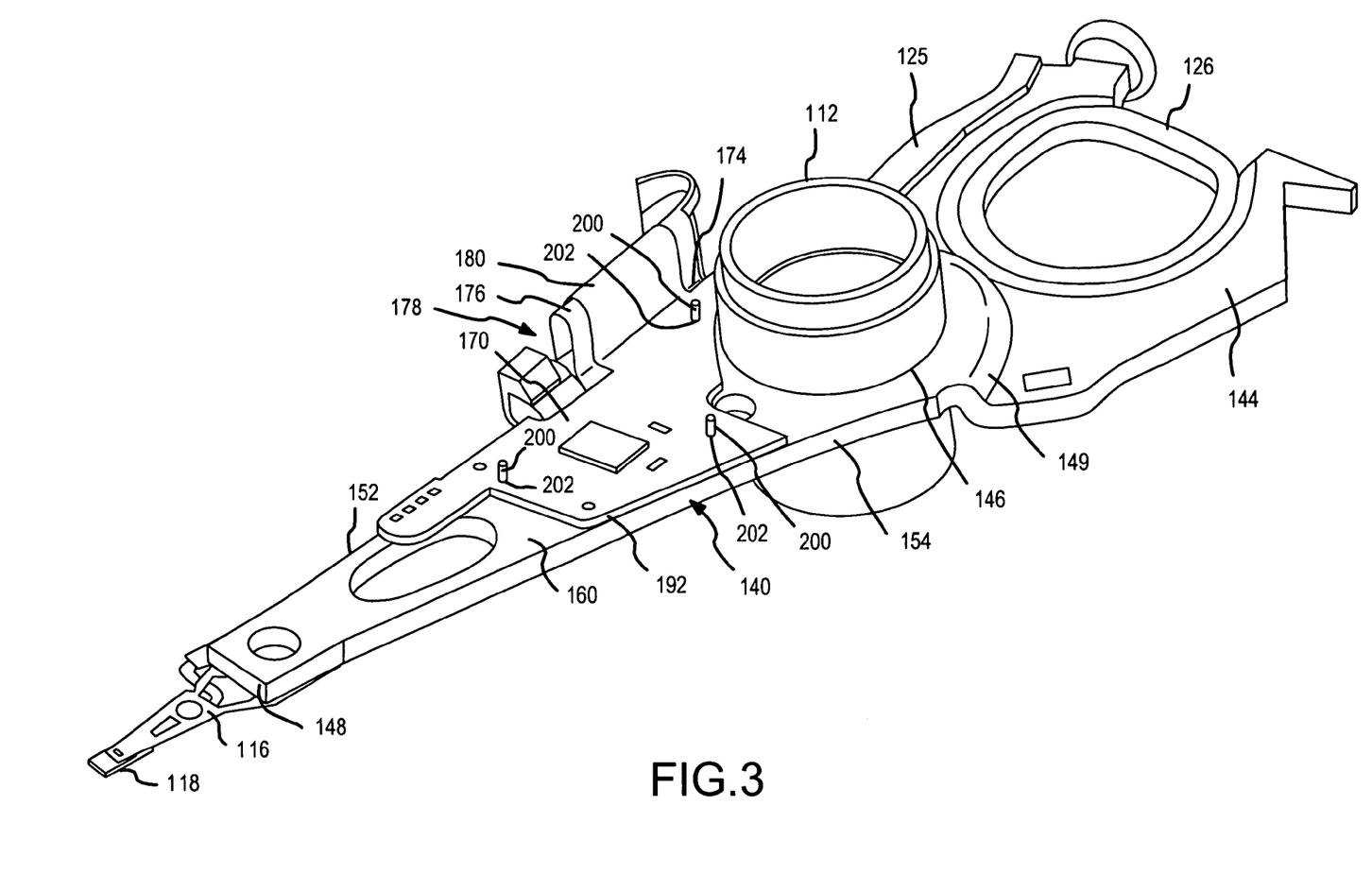
FIG. 3 is a top perspective view of the actuator assembly from FIG. 1 with the printed circuit card assembly ("PCCA") inserted over the pins.

FIG. 2 shows the actuator arm 114 of FIG. 1 in more detail, which is made from a single sheet of metal, such as steel or aluminum, having a yolk 144 at one end, a distal end 148 opposite the yolk 144, and two opposite sides 152 and 154 therebetween. The yolk 144 holds the coil 126 of the voice coil motor 124 and the distal end 148 connects to the flexure 116 as shown in FIGS. 1 and 3. An opening 146, which fits around the bearing shaft assembly 112 is located next to the yoke 144 such that the actuator arm 114 pivots about this bearing shaft opening 146 as shown in FIG. 1. A curved bend 149 that corresponds to the curve of the bearing shaft opening 146 is formed between the opening 146 and the yolk 144.

One or more head pins 200 are formed integrally with the actuator arm 114 and positioned between the bearing shaft opening 146 and the distal end 148. The head pins 200 are used to attach the PCCA 140 to that actuator arm 114. FIG. 2 shows three head pins 200, two of which are positioned near the first side 152 and one is positioned near the second side 152, such that the head pins 200 form a generally triangular shape. One or more coil pins 210 may also be formed integrally with the actuator arm 114 and positioned near the first side 152 near the bend 149. The coil pins 210 are used to attach the coil connecting cable 125 to the actuator arm where it will connect to the PCCA 140, which in turn connects to the flex cable 135 to permit communications with the PCB 132. FIG. 2 shows two coil pins 210, one located on the yolk side of the bend 149 and one located on the bearing shaft opening side of the bend 149.

As shown in FIG. 3, the PCCA 140 covers a portion of a top surface 160 of the actuator arm 114 between the bearing shaft opening 146 and the distal end 148. The PCCA 140 further comprises a flexible printed circuit 170 attached to an overmolded support card 172. The support card 172 has a first bend 174 near the first side 152 of the actuator arm 114 and a second opposite bend 176 to create a vertical U-shaped ridge 178 that is generally perpendicular to the actuator arm 114. The flexible circuit 170 has a ribbon portion 180 attached to the ridge 178 after which it connects to the flex cable 135. The coil connecting cable 125 of the PCCA 140 lies flat on the top surface 160 of the actuator arm 114 near the bearing shaft aperture 146, where it connects to the PCCA 140, and runs along the first side 152 of the yolk 144 where it connects to the coil 126 of the voice coil motor 124. The PCCA 140 has head pin openings 202 that are positioned to fit over and receive the head pins 200 when the PCCA 140 is attached to the actuator arm 114. The connecting cable 125 has coil pin openings (not shown) that are positioned to fit over and receive the coil pins 210 when the connecting cable is attached to the yolk 144.

Although the PCCA 140 is shown attached to the top surface 160 of a single actuator arm 114, the integral head pins 200 and coil pins 210 could be located anywhere on the actuator assembly where the PCCA 140 might be attached. So for example, it is well known that in disc drives that contain multiple discs, the actuator assembly has multiple actuator arms connected together with an E-shaped body, often referred to as an "E-block." It is further well-known to attach the PCCA 140 to the side of the E-block, where it may be connected to all of the actuator arms. Head pins 200 and coil pins 210 could be integrally formed in the side of the E-block to allow attachment to the PCCA.

The disc drive 100 is manufactured using the following steps. One or more discs are mounted to spindle motor 106 which is attached to the disc drive base plate 102. The bearing shaft assembly 112 is likewise attached to the base plate 102. Each actuator arm 114 is formed out of a flat sheet of metal, such as aluminum, through stamping or some other cutting process, as is well-known in the art. Various apertures, such as the bearing shaft assembly opening 146, are formed by a machine stamping process that cuts and punches shapes out of the actuator arm 114. The actuator arm 114 is bent to form the bend 149. The head pins 200 and coil pins 210 are formed integrally with the actuator arm 114 through a machine process, such as stamping or punching the pins 200 and 210 into the sheet metal actuator arm 114.

Figure 4:
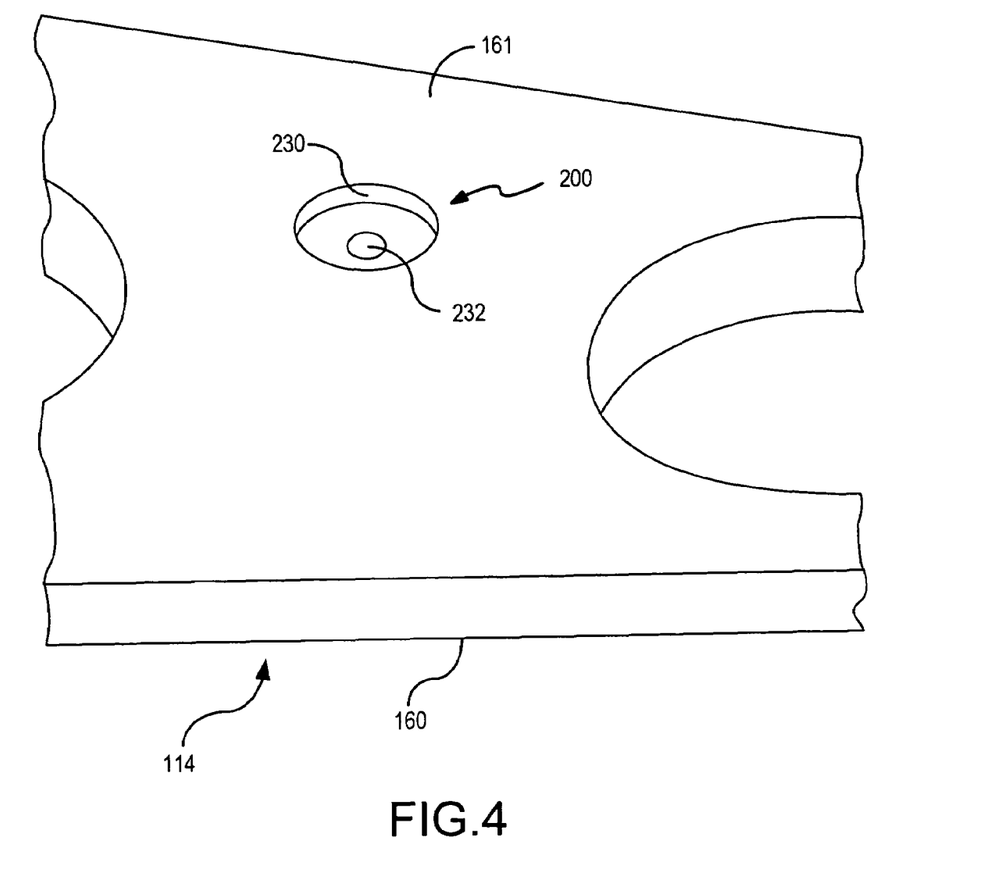
FIG. 4. is a partial bottom perspective view of one of the pins from the actuator arm of FIGS. 2 and 3.
Figure 6:
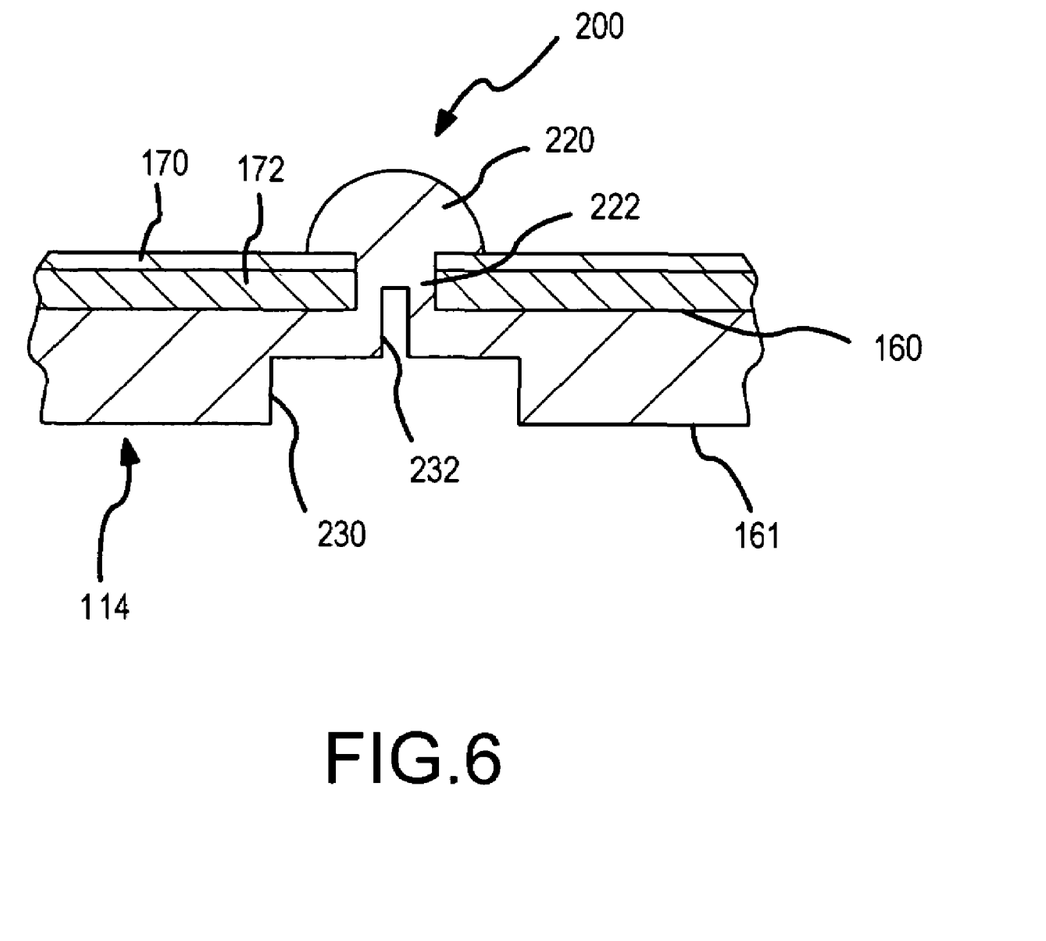
FIG. 6 is a cross-section view through lines 6-6 of FIG. 5.

FIG. 4 shows the lower surface or underside 161 of the actuator arm 114 and one of the head pins 200. Specifically, during the forming step, a circular section of the actuator arm 114, denoted by the circular recess 230, is stamped or pressed through the lower surface 161 of the actuator arm 114 and then through the upper surface 160 to form the pin 200 which protrudes out of the upper surface 160 as shown in FIGS. 2 and 3. In order to ensure that the pin 200 is long enough that a portion of the pin 200 will protrude through the pin opening 202 of the PCCA 140 as shown in FIG. 3, an additional recess 232 is created within the interior of a portion of the pin 200. A section view of the pin 200 and recesses 230 and 232 is shown in FIG. 6.

Figure 5:
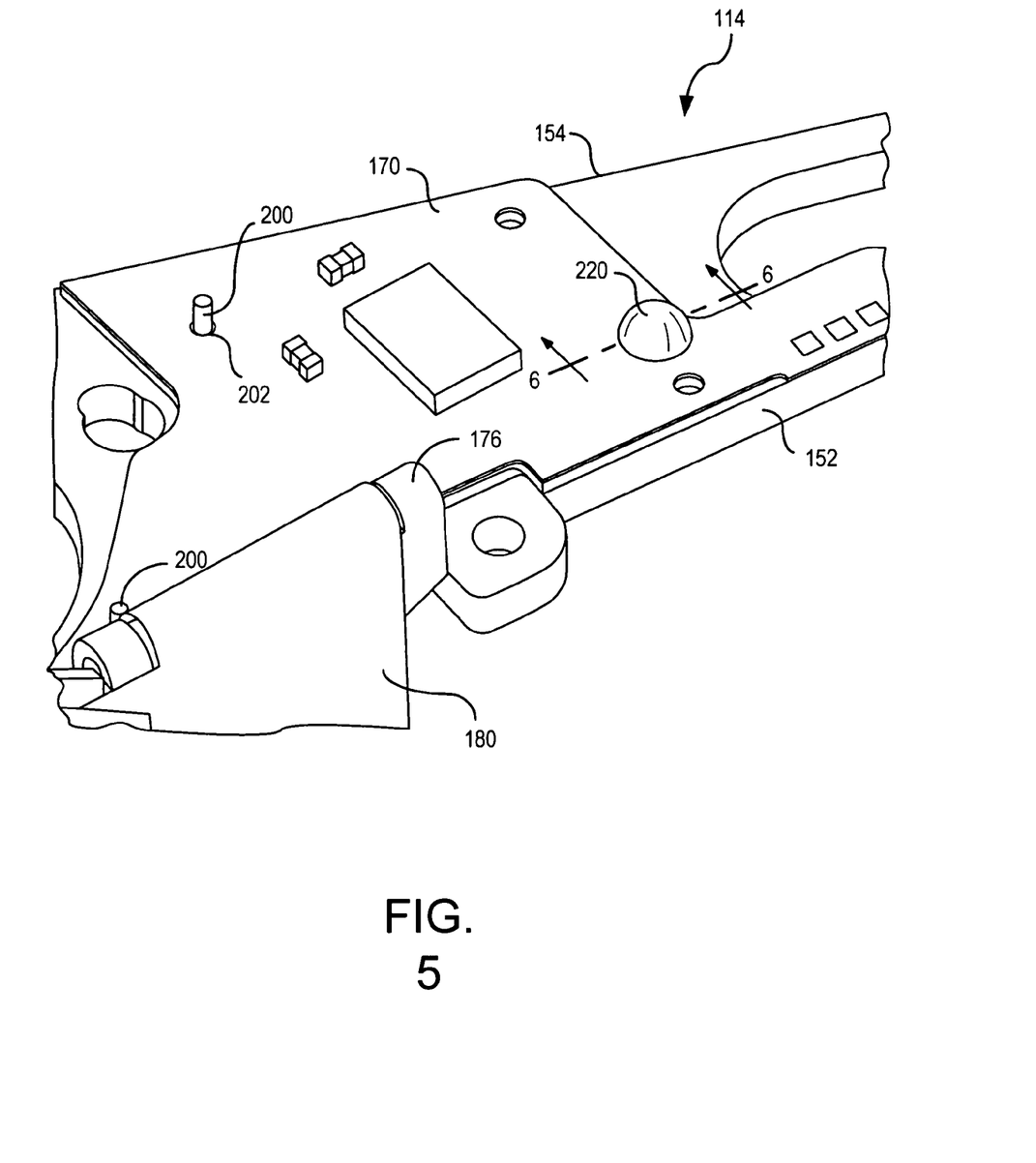
FIG. 5 is a top perspective view of the actuator assembly from FIG. 1 with the PCCA attached to the actuator assembly illustrating the pins after pressure has been applied to form the pin cap.

The actuator arm 114 is attached to the bearing shaft assembly 112. The PCCA 140 is next attached to the actuator arm 114 by positioning it so that the head pin openings 202 are aligned over the head pins 200 and then pressing the PCCA 140 onto the actuator arm 114 so that the pins 200 are inserted into the openings 202. A machine may perform the insertion step. Next, the pins 200 are attached to the PCCA 140. One way to perform the attaching step is to apply pressure to the top of the head pins 200 causing them to deform in a mushroom-type shape and form a cap 220 over the PCCA 140 and a stem 222 (shown in FIG. 6) surrounded by the head pin opening 202 of the PCCA 140, thereby permanently securing the PCCA 140 to the actuator arm 114 as shown in FIGS. 5 and 6. The mushroom cap 220 should protrude over the PCCA 140 as shown in FIGS. 5 and 6 to secure the PCCA 140 to the actuator arm 114. Specifically, in this embodiment, the pin openings 202 surround only the stem 222 and the cap 220 prevents the pin openings 202 from moving relative to the stem 222. The head pins 200 may be of any size and shape so long as a portion of the pin 200 protrudes through the PCCA 140 after the insertion step as shown in FIG. 3. For example, the pins 200 may have a height of 0.055 inches and an outer diameter of 0.018 inches. Another way to perform the attaching step is to solder the pins 200 to the PCCA 140.

The coil connecting cable 125 of the PCCA 140 is connected to the actuator arm 114 using the same method. Namely, the coil connecting cable 125 is positioned so that the coil pin openings are aligned over the coil pins 210 and then the connecting cable 125 is pressed onto the actuator arm 114 so that the coil pins 210 are inserted into the coil pin openings. A machine may perform the insertion step. Next, the pins 210 are attached to the connecting cable 125 using either of the two methods referenced above.

In summary, a method for attaching a printed circuit card assembly (such as 140) to an actuator assembly (such as 110) in a disc drive (such as 100) includes three steps. First, a plurality of pins (such as 200 and 210) are formed integrally, by stamping or some other method, with the actuator assembly (such as 110). Next, the pins (such as 200 and 210) are inserted through a plurality of pin openings (such as 202 and 212) (such as 202 and 212) in the printed circuit card assembly (such as 140). Then, the pins (such as 200 and 210) are attached to the printed circuit card assembly (such as 140). The attaching step may be done by applying pressure to a top surface of the pins (such as 200 and 210) to cause them to deform over the printed circuit card assembly (such as 140). Alternatively, the attaching step may be accomplished by soldering the pins (such as 200 and 210) to the printed circuit card assembly (such as 140). A plurality of pins (such as 200 and 210) shall mean two or more pins (such as 200 and 210), each of which may have a diameter of about 0.018 inches and a height of about 0.055 inches. One or more of the forming, inserting, or attaching steps may be performed by a machine. The pins (such as 200 and 210) may be inserted into pin openings (such as 202 and 212) (such as 202 and 212) in any portion of the printed circuit card assembly (such as 140), including without limitation, the flexible printed circuit (such as 170) or the coil connecting cable (such as 125). The pins (such as 200 and 210) may be formed in any portion of the actuator assembly (such as 110), including without limitation, the actuator arm (such as 114) or the actuator body or E-block.

A disc drive (such as 100) comprises an actuator assembly (such as 110) pivotally attached to a base plate, having a pin (such as 200 or 210) formed integrally with the actuator assembly (such as 110), and a printed circuit card assembly (such as 140) attached to the pin on the actuator assembly (such as 110). The printed circuit card assembly (such as 140) has pin openings (such as 202 and 212) (such as 202 and 212) that surround the pins (such as 200 and 210), each of which may have a stem (such as 222) and a cap (such as 220). The pin openings (such as 202 and 212) (such as 202 and 212) surround only the stem (such as 222) and the cap (such as 220) prevents the pin openings (such as 202 and 212) (such as 202 and 212) from moving relative to the stem (such as 222).

It will be clear that the present invention is well adapted to attain the ends and advantages mentioned as well as those inherent therein. While a presently preferred embodiment has been described for purposes of this disclosure, various changes and modifications may be made which are well within the scope of the present invention. For example, the disc drive may have any number of head pins and coil pins. Moreover, the integral pins may be formed directly on the actuator arm or on an actuator body or E-block. Further, the integral pins might be used to connect circuits other than the printed circuit card assembly to disc drive elements other than the actuator assembly. Numerous other changes may be made which will readily suggest themselves to those skilled in the art and which are encompassed in the spirit of the invention disclosed and as defined in the appended claims.

What is claimed is:

1. A method for attaching a printed circuit card assembly to an actuator assembly in a disc drive, the method comprising the steps of:
   (a) forming a plurality of pins integrally with the actuator assembly such that the pins and actuator assembly are formed from a single, continuous piece of material;
   (b) inserting The pins through a plurality of pin openings in the printed circuit card assembly; and
   (c) attaching the pins to the printed circuit card assembly.

2. The method of claim 1 wherein the attaching step (c) further comprises applying pressure to a top surface of the pins to cause them to deform over the printed circuit card assembly.

3. The method of claim 1 wherein the attaching step further comprises soldering the pins to the printed circuit card assembly.

4. The method of claim 1 wherein the forming step (a) comprises stamping.

5. The method of claim 1 wherein the plurality of pins comprises at least three pins.

6. The method of claim 1 wherein the pins have a diameter of about 0.018 inches.

7. The method of claim 1 wherein the pins have a height of about 0.055 inches.

8. The method of claim 1 wherein the forming step (a) is performed by a machine.

9. The method of claim 1 wherein the inserting step (b) is performed by a machine.

10. The method of claim 1 wherein the attaching step (c) is performed by a machine.

11. The method of claim 1 wherein the inserting step (b) further comprises inserting one of the pins into a pin opening in a flexible printed circuit electrically connected to a disc drive read/write head.

12. The method of claim 1, wherein the inserting step (b) further comprises inserting one of the pins into a pin opening in a connecting cable electrically connected to a disc drive voice coil motor.

13. The method of claim 1 wherein the actuator assembly has an actuator arm and the pins are formed integrally with the actuator arm.

14. A disc drive comprising:
   an actuator assembly pivotally attached to a base plate and having a pin formed integrally with the actuator assembly such that the pins and actuator assembly are formed from a single, continuous piece of material; and a printed circuit card assembly attached to the pin on the actuator assembly.

15. The disc drive of claim 14 further comprising a plurality of pins formed integrally with the actuator assembly.

16. The disc drive of claim 15 wherein the printed circuit card assembly has pin openings that surround the pins.

17. The disc drive of claim 16 wherein the pins have a stem and a cap.

18. The disc drive of claim 17 wherein the pin openings surround only the stem and the cap prevents the pin openings from moving relative to the stem.

19. The disc drive of 15 wherein the actuator assembly has an actuator arm and the plurality of pins are formed integrally with the actuator arm.

20. A disc drive comprising:
an actuator assembly pivotally attached to a base plate;
a printed circuit card assembly electrically connected to a read/write head attached to an end of the actuator assembly for accessing data stored on a rotating data storage disc; and
means for attaching the printed circuit card assembly to the actualor assembly.

21. The disc drive of claim 20 wherein the means comprises pins formed integrally with the actuator assembly.

22. The disc drive of claim 21 wherein the actuator assembly comprises an actuator arm and the pins are formed integrally with the actuator arm.

* * * * *